United States Patent
Grodzki

(10) Patent No.: US 10,571,541 B2
(45) Date of Patent: Feb. 25, 2020

(54) MAGNETIC RESONANCE IMAGING APPARATUS, AND METHOD FOR THE OPERATION THEREOF

(71) Applicant: Siemens Healthcare GmbH, Erlangen (DE)

(72) Inventor: David Grodzki, Erlangen (DE)

(73) Assignee: Siemens Healthcare GmbH, Erlangen (DE)

(*) Notice: Subject to any disclaimer, the term of this patent is extended or adjusted under 35 U.S.C. 154(b) by 0 days.

(21) Appl. No.: 16/244,384

(22) Filed: Jan. 10, 2019

(65) Prior Publication Data

US 2019/0212405 A1 Jul. 11, 2019

(30) Foreign Application Priority Data

Jan. 10, 2018 (DE) .................. 10 2018 200 290

(51) Int. Cl.
| | | |
|---|---|---|
| *G01R 33/483* | (2006.01) | |
| *G01R 33/36* | (2006.01) | |
| *G01R 33/58* | (2006.01) | |
| *G01R 33/54* | (2006.01) | |
| *G01R 33/48* | (2006.01) | |

(52) U.S. Cl.
CPC ..... *G01R 33/4835* (2013.01); *G01R 33/3614* (2013.01); *G01R 33/4828* (2013.01); *G01R 33/543* (2013.01); *G01R 33/583* (2013.01)

(58) Field of Classification Search
CPC ............ G01R 33/4835; G01R 33/3614; G01R 33/583; G01R 33/543; G01R 33/4828
See application file for complete search history.

(56) References Cited

FOREIGN PATENT DOCUMENTS

DE 102017220697 A1 5/2019

OTHER PUBLICATIONS

German Office Action for 102018200290.8 dated Nov. 12, 2018 (English-language translation attached).
German Decision to Grant for 102018200290.8 dated Mar. 20, 2019 (English-language translation attached).

*Primary Examiner* — Dixomara Vargas
(74) *Attorney, Agent, or Firm* — Schiff Hardin LLP

(57) ABSTRACT

In a magnetic resonance imaging (MRI) apparatus and a method for operation thereof, for a specified slice of a subject under examination, which slice is to be excited, an excitation frequency $f_A^+$ and $f_A^-$ is determined for each of two opposite polarities of a slice-selection gradient for an associated RF excitation pulse. In addition, for a specified nominal center frequency $f_0$ of the MRI apparatus, a difference between $f_A^+$ and $f_0$ and a difference between $f_A^-$ and $f_0$ are determined. The polarity is then set such that a smaller of the two differences is achieved.

9 Claims, 2 Drawing Sheets

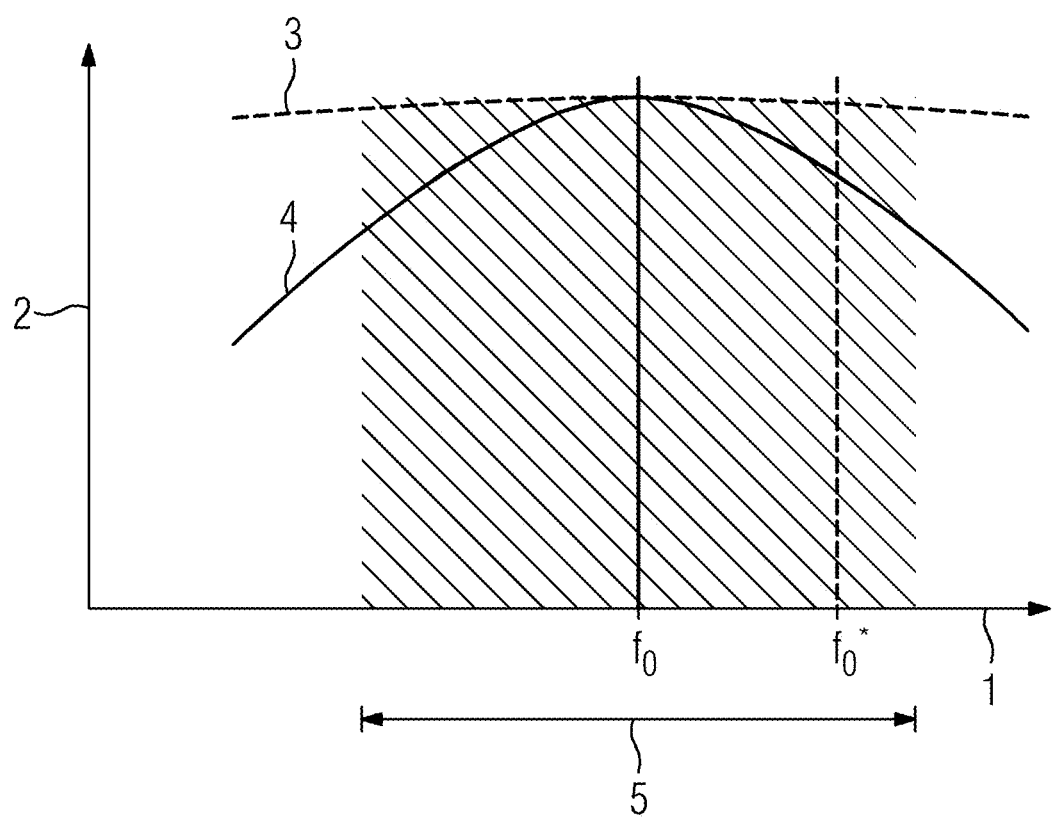

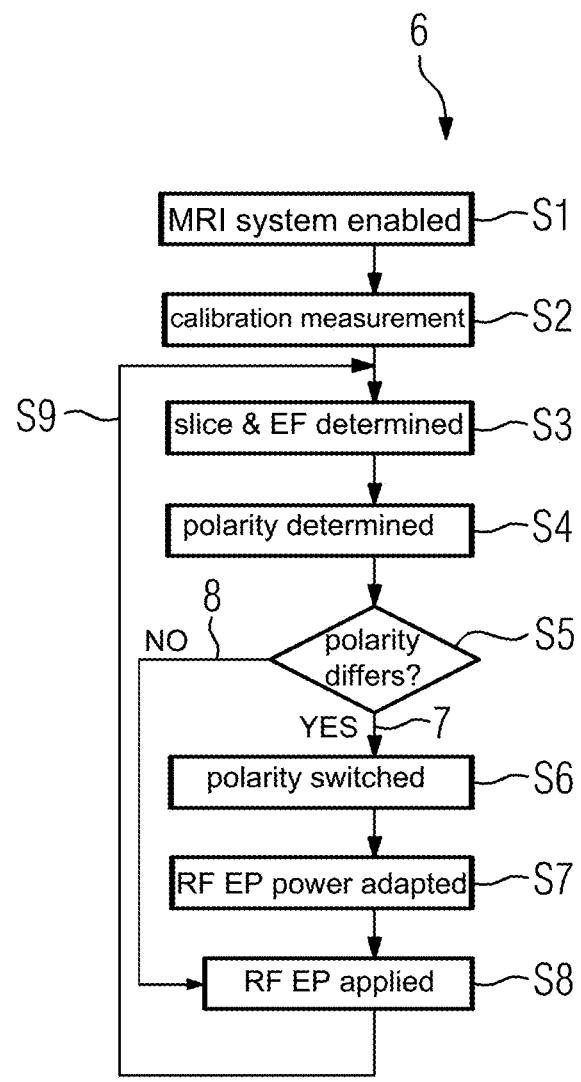

MAGNETIC RESONANCE IMAGING APPARATUS, AND METHOD FOR THE OPERATION THEREOF

BACKGROUND OF THE INVENTION

Field of the Invention

The invention concerns a method for operating a magnetic resonance imaging (MRI) system. The invention also concerns an MRI system, and a non-transitory, computer-readable data storage medium containing corresponding program code, that implement such a method.

Description of the Prior Art

Magnetic resonance imaging (MRI) is a known imaging technique in medical technology. In this technique, a subject under examination, for instance a patient, is exposed to a magnetic field, which is as static as possible, and on which is applied or superimposed a gradient, i.e. a gradient field that increases linearly in space. The gradient is likewise as static as possible. Then radio-frequency pulses (RF pulses), i.e. an alternating magnetic field, are applied, which excite certain nuclear spins in the patient. The RF pulses are generated by an RF power amplifier (RFPA). The parts of the subject under examination in which the nuclear spins are excited to resonance depend on the effective local strength of the magnetic field and the frequency of the RF pulses, because the resonant frequency of the nuclear spins is itself dependent on the local magnetic field strength. Thus by suitable variation, a specific slice of the subject under examination can be excited selectively in a targeted manner.

In practice, additional components, for instance additional magnetic fields and/or pulses, are often used, for instance to allow precise association of a measured relaxation signal or echo to a specific volume element or voxel of the subject under examination, and hence to allow reconstruction of an associated 2D or 3D image that can be used graphically for diagnostic purposes. An example of an additional component of this type, or more precisely of an additional field of this type, is a "slice-selection gradient". This is an additional magnetic field, which typically is not applied statically in a continuous manner but only relatively briefly, and which produces an additional linear magnetic gradient and thus allows a finer selection of the excited slice or volume elements of the subject under examination.

Since the MRI system and its components are not theoretically ideal parts, however, additional effects must be taken into account in reality. For instance, depending on the construction and design, the RF power amplifier has a particular frequency range within which the RF pulses can be generated, in particular can be generated with at least a certain minimum power. In fact even with a maximum load factor for the RF power amplifier, the power of a generated RF pulse depends on its frequency. Moreover, although the MRI system is specified or designed to produce the aforementioned magnetic fields, in particular the static magnetic field, usually denoted by $B_0$, at a defined field strength, or strength for short, in reality variations therefrom can occur. The dependence of the resonant frequency of the nuclear spins on the local magnetic field strength means that this must then be corrected by a suitably adjusted frequency of the RF pulse if a specific slice or a specific volume element of the subject under examination is still meant to be excited to resonance precisely.

Ultimately this can mean that, in order to excite a specific slice of the subject under examination, an RF pulse would be needed at a frequency or in a frequency range in which the RF power amplifier is unable to output sufficient power or any power at all. This problem has previously been addressed by specifying or allowing correspondingly larger tolerances, or in other words accepting a correspondingly lower image quality. Additionally or alternatively, an RF power amplifier can be used that is designed to generate RF pulses of the required power over a correspondingly larger frequency range. This is technically demanding, however, and therefore associated with costs and component complexity that may not always be viable.

SUMMARY OF THE INVENTION

An object of the present invention is to facilitate operating an MRI system with greater efficiency and/or effectiveness, without additional component complexity compared with conventional MRI systems.

The method according to the invention operates an MRI system for exciting a specified slice of a subject under examination, in particular of a patient. In this method, each of the possible, opposite polarizations of a magnetic slice-selection gradient that passes through the subject under examination at least in the region of the specified slice to be excited, and is produced by the MRI system, is determined by calculating an associated excitation frequency for the corresponding polarization, this frequency being needed for an RF excitation pulse in order to excite the specified slice. For one of the two polarizations, the necessary excitation frequency is denoted by $f_A^+$, whereas the necessary excitation frequency for the other, i.e. opposite, polarization is denoted by $f_A^+$.

A nominal center frequency $f_0$, at which an RF power amplifier of the MRI system for generating the RF excitation pulse can output its maximum power, is specified for the MRI system. The center frequency $f_0$ also defines a strength of a static magnetic field $B_0$ that the MRI system can produce according to the specification. The center frequency $f_0$ is related to the static magnetic field $B_0$ by the equation $f_0 = \gamma \cdot B_0$, where $\gamma$ denotes the gyromagnetic ratio. Thus an excitation frequency of 63.9 MHz is obtained, for example, for a magnetic field strength of 1.5 T. For this center frequency $f_0$, a difference between $f_A^+$ and $f_0$ and a difference between $f_A^-$ and $f_0$ are determined by calculation. The polarity of the slice-selection gradient for exciting the specified slice is then set according to the difference that is the smaller in magnitude of the two determined differences. The thereby set polarity of the slice-selection gradient can then be used to excite the specified slice in order to measure, i.e. record, a corresponding echo or image signal.

Depending on the set polarity of the slice-selection gradient, the effective magnetic field passing through at least portions of the subject under examination can be increased or decreased. With reference to the same spatial direction, the slice-selection gradient, or more precisely a component produced thereby of the effective magnetic field, hence increases linearly for the one polarity while it decreases linearly for the opposite polarity. Thus each of the two polarities is thereby also associated automatically with one of the two excitation frequencies $f_A^+$, $f_A^-$ for each location, so in this case for the specified slice, of the subject under examination. Thus either the higher excitation frequency $f_A^+$ or the lower excitation frequency $f_A^-$, depending on the set polarity of the slice-selection gradient, is needed to excite one and the same specified slice. The setting can be made here by suitable control of a magnet or a coil that is provided as part of the MRI system for producing the slice-selection gradient.

By setting or switching-over the polarity of the slice-selection gradient accordingly, the excitation frequency actually needed to excite the specified slice can be selected on the basis of taking into account the differences, i.e. the separations from the center frequency $f_0$, such that it lies closer to the center frequency $f_0$. In general it can hence be advantageously achieved that by setting the polarity, the excitation frequency $f_A^+$ or $f_A^-$ currently actually needed to excite the specified slice lies closer to a point at which the RF power amplifier can output or provide a higher or maximum power in a frequency range specified for the RF power amplifier.

Alternatively or additionally, by setting the polarity, the RF power amplifier can be operated in a more protective manner, i.e. with a power output that is lower relative to the maximum power that can be generated by, or obtained from, the RF power amplifier for the frequency concerned. It is thereby possible, for example, to reduce wear on the RF power amplifier. If the polarity of the slice-selection gradient is switched over, then, for example, an improved signal quality, for instance in terms of a signal-to-noise ratio, and hence ultimately an improved image quality, can be achieved by virtue of the fact that the power of the corresponding RF pulse for exciting the specified slice that can be obtained from the RF power amplifier is then advantageously higher. Thus better, i.e. greater, utilization of the maximum power that can be provided by the RF power amplifier is possible.

"Setting" within the meaning of the present invention can hence mean an actual switchover. Equally, it can mean or include checking a present setting, i.e. checking the present polarity. If the polarity corresponding to the smaller difference is already present, then "setting" according to the invention need not mean or include an additional or repeated switchover. In such a case, "setting" within the meaning of the present invention can thus mean that the polarity, in particular after it has been checked, is left in its present setting.

Thus the method proposed here takes into account a present situation or a present status of the MRI system, and automatically adjusts the MRI system or its setting or parameters, in particular the slice-selection gradient and hence the associated necessary excitation frequency. It can hence be achieved or ensured, in particular when an excitation or saturation of a slice outside an isocenter of the MRI system is required, that the excitation frequency needed for the associated excitation lies within the frequency range or frequency band specified for the RF power amplifier.

In addition, the method according to the invention can take into account further parameters or variables such as, for instance, a predetermined length and/or width or bandwidth of the RF excitation pulse. These parameters may be predetermined, for example because of external constraints or conditions, for instance in accordance with, or as part of, an associated measurement sequence. They can then be taken into account, for example, in evaluating the differences obtained. In other words, a decision over whether the polarity of the slice-selection gradient is actually switched over can thus be made on the basis of, or taking into consideration, such parameters. It may thereby be possible to reduce the amount of switching, and thus ultimately likewise the wear, of the RF power amplifier. For instance, it is possible to forgo switching over the polarity if, taking into consideration the further parameters, it is determined that a power benefit achievable by the switchover lies below a specified threshold value. It may thereby also be possible to increase advantageously an implementation speed of a corresponding measurement or measurement sequence.

In an embodiment of the present invention, a signed difference between the specified nominal center frequency $f_0$ and a frequency $f_0^*$, which defines a currently actually existing strength of the static magnetic field $B_0$, is determined before determining the polarization-dependent excitation frequencies $f_A^+$ and $f_A^-$. In other words, the present status of the MRI system is determined, and thereby the deviation of the present actual status from a reference status based on a technical specification of the MRI system. The deviation can then advantageously be taken into account in the method according to the invention. This is particularly advantageous because when the frequency $f_0^*$ differs from the specified nominal center frequency $f_0$, there is a risk that, in particular if the polarity of the slice-selection gradient is not set or switched over, the excitation frequency needed to excite the specified slice may lie outside the frequency band or frequency range specified for the RF power amplifier.

This frequency range of the RF power amplifier is usually defined or designed for the specified nominal center frequency $f_0$. For instance, the center frequency $f_0$ can lie in the region of the specified frequency range of the RF power amplifier, and therefore the RF power amplifier is designed to achieve its maximum power output at this frequency. As a result of various factors and influences, the frequency $f_0^*$ that actually exists, i.e. the strength of the static magnetic field $B_0$ actually producible or produced by the MRI system, may deviate from the corresponding specified value, for instance the value specified in a data sheet. Examples of what may cause or contribute to such a deviation include a setup or conversion of the MRI system, installation of the MRI system, maintenance or servicing, quenching, an irregularity during ramp-up of the MRI system or of the relevant magnet for establishing the static magnetic field, a change in a thermal situation or environment of the MRI system, aging effects and/or the like.

By taking into account the deviation, for instance by evaluating the specific differences and/or by setting the polarity of the slice-selection gradient, associated negative, i.e. unwanted, effects can advantageously be evaluated particularly accurately and reliably, and, if applicable, i.e. if needed, can be corrected by switching over the polarity. It should be noted that, regardless of whether a corresponding deviation is determined or identified, the MRI system always works on the basis of the actually existing frequency $f_0^*$, and therefore by taking into account the deviation from the nominal center frequency $f_0$, the specified slice, for example, can be excited with improved precision or accuracy.

In another embodiment of the present invention, the frequency $f_0^*$ is determined by a calibration measurement, in which a spectrum is acquired using the MRI system without applied magnetic gradients, and a position of a characteristic water peak is found in the spectrum. The water peak is a characteristic signal waveform that can usually be identified clearly. From its position within the spectrum, it is possible to deduce by calculation the strength of the actually present or existing magnetic field and hence the corresponding frequency $f_0^*$. The calibration measurement can be performed, for example, at regular time intervals and/or after any event that potentially or actually influences the frequency $f_0^*$. The currently determined value for the frequency $f_0^*$ can then preferably be stored or saved as a retrievable parameter in a suitable data storage device of the MRI system. It can then be retrieved and used, for example by a controller of the MRI system and/or by an analysis or data processing device, for subsequent measurements, so for instance for an examination of the patient.

In an advantageous development of the present invention, determining the differences and setting the polarity is performed only when a magnitude of the difference between $f_0^*$ and $f_0$, i.e. a possibly ascertained difference, exceeds a predetermined absolute or relative threshold value. In other words, implementing or executing the further method steps of the method according to the invention can be confined to cases or situations in which the actual frequency $f_0^*$ and hence the actual strength of the static magnetic field $B_0$ deviates from the respective specified nominal values by more than a predetermined amount. In this case, the threshold value can be determined on the basis of a tolerance or a plurality of tolerances of the MRI system or of components thereof, which tolerances define, for example, a setting accuracy and/or measurement accuracy. The threshold value can also be adjustable according to situation, application and/or need. It is thereby possible to minimize a switching or operating complexity of the MRI system, in particular according to situation, while simultaneously achieving an image quality that is sufficient for the particular application.

In another advantageous embodiment of the present invention, the static magnetic field is produced at a strength of 1 T maximum. In other words, the method according to the invention is thus applied in, or to, a low-field system, i.e. a low-field MRI system. This can be contrasted with a corresponding high-field system, in which a static magnetic field is used at a strength of typically 1.5 to 3 T. Applying the present invention in a low-field system of this type, i.e. in an actual magnetic field strength of in particular less than 1 T, is particularly advantageous because a power that can be applied, i.e. the maximum power that can be output by the RF power amplifier for, or in the form of, the RF excitation pulses, in this case generally has a greater frequency dependence than in a high-field system, i.e. than for a strength of the static magnetic field of at least 1.5 T.

Thus in typical low-field systems, as the deviation from the specified center frequency $f_0$ increases, the maximum power that can be output or generated by the particular RF power amplifier decreases more sharply than in a high-field system. By virtue of the present invention, it is therefore advantageously possible to dispense with a correspondingly higher-performance or more powerful design of the RF power amplifier and hence to reduce both a technical complexity of the MRI system and production and operating costs of the MRI system. The present invention also allows the use of such low-field systems in a particularly flexible and reliable manner, including even for exciting slices at a relatively greater distance from the given isocenter than is possible using conventional operating methods for low-field systems when employing the same RF power amplifier.

In another embodiment of the present invention, determining the differences and the corresponding setting of the polarity are performed once per repetition time in a sequence composed of a multiplicity of RF excitation pulses. In other words, it can thus be advantageously achieved for each RF excitation pulse as central a position as possible of the associated excitation frequency with respect to the specified nominal center frequency $f_0$ or with respect to the specified or permitted frequency range of the RF power amplifier. It is thereby advantageously possible to achieve better utilization of the available power from the RF power amplifier and thus ultimately to achieve an improved image quality. It is a particular advantage of the present invention here that this result, i.e. these benefits, can actually be achieved or realized for each RF excitation pulse, because only the slice-selection gradient is set and there is no need to adjust or alter, for instance, the static magnetic field $B_0$ itself or the gradient field, typically denoted by $B_1$. The latter would involve a far greater level of complexity.

In another embodiment of the present invention, a power output from the RF power amplifier is also adjusted when setting the polarity. In other words, if the polarity is switched over, for instance with respect to a conventionally hard-coded, i.e. fixed, polarity or setting, use is made of a power reserve available from the RF power amplifier as a result of the then smaller difference between the associated excitation frequency $f_A^+$ or $f_A^-$ to be used and the specified nominal center frequency $f_0$, for instance by increasing the power of the associated RF excitation pulse. Such increased power of the RF excitation pulse can ultimately result in improved image quality and thus, if applicable, to a more reliable diagnosis for the patient.

The present invention also encompasses an MRI system (apparatus). The MRI system according to the invention has a data acquisition scanner with a basic field magnet that produces a static magnetic field, at least one auxiliary magnet for producing a slice-selection gradient that is superimposed at least intermittently on at least portions of the static magnetic field, an RF power amplifier for generating an RF excitation pulse for exciting a specified slice of a subject under examination, and a controller that controls the production of the slice-selection gradient. The MRI system, in particular the controller, is configured to calculate for each of the possible, opposite polarities of the slice-selection gradient, an associated excitation frequency $f_A^+$ and $f_A^-$, respectively needed for the corresponding RF excitation pulse for exciting the specified slice. The MRI system, in particular the controller, is also configured to determine by calculation a nominal center frequency $f_0$ specified for the MRI system, a respective difference between $f_A^+$ and $f_0$, and a difference between $f_A^-$ and $f_0$.

The center frequency $f_0$ in this context is the frequency at which the RF power amplifier can output its maximum power. The center frequency $f_0$ also defines a strength of the static magnetic field $B_0$ that the MRI system can produce according to the specification.

The MRI system, in particular the controller, is also configured to set the polarity of the slice-selection gradient for the excitation of the specified slice according to the difference that is the smaller in magnitude of the two determined differences. The MRI system according to the invention can be designed and configured in particular to execute or implement at least one embodiment or design of the method according to the invention. The MRI system according to the invention, in particular the controller, can comprise for this purpose at least one processor unit (CPU) and a data storage medium or data memory connected to the processor unit via at least one data line.

The present invention also encompasses a non-transitory, computer-readable data storage medium encoded with programming instructions that, when the storage medium is loaded into a computer or computer system of an MRI apparatus, cause the MRI apparatus to be operated so as to implement any or all embodiments of the method according to the invention, as described above.

The use of such a data storage medium allows an existing MRI apparatus to be retrofitted so as to operate in accordance with the invention.

The properties and developments of the method according to the invention that are described above and below, and the associated advantages, also apply to the MRI system according to the invention, and the data storage medium according to the invention. Embodiments of the MRI system according to the invention and of the data storage medium according to the invention, which correspond to the embodiments of the method, thus are not described here explicitly, in order to avoid unnecessary redundancy.

BRIEF DESCRIPTION OF THE DRAWINGS

FIG. 1 schematically illustrates the frequency dependence on the power that can be emitted as an output by an RF power amplifier for different magnetic field strengths.

FIG. 2 is a flowchart of an exemplary embodiment of the method for operating an MRI system according to the invention.

DESCRIPTION OF THE PREFERRED EMBODIMENTS

The exemplary embodiments explained below are preferred embodiments of the invention. In the exemplary embodiments, the described components of the embodiments each constitute separate features of the invention to be considered independently of one another which develop the invention in each case also independently of one another and hence can also be considered to be part of the invention individually or in a different combination from that shown. In addition, further features of the invention that have already been described can also be added to the described embodiments.

FIG. 1 schematically illustrates a frequency dependence of a power that can be output by an RF power amplifier, in particular of an MRI system, for different magnetic field strengths. In the figure, the frequency is plotted on an abscissa 1, and the power that can be output is plotted on an ordinate 2, in each case in arbitrary units. The diagram shows a high-field power curve 3 and a low-field power curve 5. The former applies to a high-field system having a static magnetic field strength of 1.5 T, for example, whereas the latter applies to a low-field system having a static magnetic field strength of less than 1 T. The diagram also shows or indicates an allowed or specified frequency range 5 of the RF power amplifier. According to the specification, i.e. the technical design, of the RF power amplifier, the power that can be output by this amplifier reaches its maximum at a specified nominal center frequency $f_0$ irrespective of the magnetic field strength. It can also be seen clearly, however, that, as the magnitude of the frequency deviation from the center frequency $f_0$ increases, the low-field power curve 4 falls off more sharply than the high-field power curve 3. As a result of the sharper fall in the power for a weaker magnetic field, an RF power amplifier for a low-field system, i.e. for low-field applications having a maximum strength of the associated static magnetic field of 1 T, must overall be designed to be more powerful or of higher performance than an RF power amplifier for a high-field system, if it is meant to guarantee over the specified frequency range 5 the same amount of power that can be output or applied.

In a real MRI system, the particular RF power amplifier is adapted to a strength of the producible static magnetic field, which strength is specified for the MRI system concerned. Thus the center frequency $f_0$ also defines the nominal strength of the static magnetic field that can be produced by the MRI system, for instance the strength intended by the manufacturer, i.e. the specified strength. In practice, however, it is a challenge actually to achieve this technically specified or intended center frequency $f_0$ or the corresponding strength of the static magnetic field. As a result of various factors and influences, a strength of a static magnetic field that actually exists or is achieved when the MRI system is actually in operation may differ from the specified value. A frequency $f_0^*$ corresponding to the actual magnetic field strength is also plotted here by way of example. It can be seen clearly that in particular for the low-field power curve 4, the power from the RF power amplifier that can be applied for the actual frequency $f_0^*$ is significantly lower than the power that can be applied at the nominally intended frequency $f_0$.

This problem is the reason why relative large associated tolerances are provided nowadays. In particular when a slice or a volume element of a subject under examination, in particular of a patient, outside an isocenter of the particular MRI system is meant to be excited or saturated, the situation can arise, however, in which the power that can be applied for the actual frequency $f_0^*$ is already too low to obtain usable image information. Since the specified frequency range 5 of the RF power amplifier is tuned to, or designed for, the intended specified center frequency $f_0$, the situation may also arise in which the excitation frequency for exciting a particular specified slice lies outside the specified frequency range 5 for the actual static magnetic field strength that corresponds to the actual frequency $f_0^*$. Then it may not be possible to perform or carry out the intended excitation as planned, because the excitation frequency currently required is likewise shifted accordingly by the deviation of the actual frequency $f_0^*$ from $f_0$.

FIG. 2 is a flowchart 6 as an example of the method for operating an MRI system. The method begins with a method step S1 in which, for example, the MRI system can be put into operation. Before an actual examination of the patient, a calibration measurement for determining the currently existing actual frequency $f_0^*$ is performed in a method step S2, with any difference that may exist between $f_0^*$ and $f_0$ also being determined.

Then, in a method step S3, as part of the examination of the patient, a slice of the patient, which slice is to be excited or saturated, is specified, and the excitation frequency needed to excite this specified slice is determined. In this step, two different excitation frequencies $f_A^+$ and $f_A^-$ are actually determined here, which correspond to different polarities of a slice-selection gradient of the MRI system. Since the different polarities of the slice-selection gradient result in an altered total magnetic field strength or effective magnetic field strength in the region of the specified slice to be excited, the two possible excitation frequencies $f_A^+$ and $f_A^-$ associated with the two polarities also differ from one another.

In a method step S4, the magnitudes of the differences $f_A^+-f_0$ and $f_A^--f_0$ are calculated, and the difference that is the smaller in magnitude of these two differences is determined. In other words, it is determined here, for which of the two possible polarities of the slice-selection gradient, the excitation frequency $f_A^+$ or $f_A^-$ respectively needed to excite the specified slice lies closer to the frequency $f_0$ and hence lies more centrally, or closer to the center, in the specified frequency range 5 of the RF power amplifier.

In a method step S5, the polarity of the slice-selection gradient associated with the ascertained smaller of the two determined differences is then compared with a present setting for exactly this polarity. If a disparity is ascertained here, i.e. the presently set polarity differs from the polarity associated with the smaller of the two differences, then the method follows a first path 7 to a method step S6.

In the method step S6, the slice-selection gradient, or more precisely its polarity, is then switched over automatically, i.e. set such that the smaller of the two differences is implemented in the excitation of the specified slice. This switchover or setting of the polarity of the slice-selection gradient thus shifts the excitation frequency needed for exciting the specified slice closer to $f_O$ absolutely and in particular relative to $f_O$. Such a shift in the excitation frequency is needed especially for excitation or saturation of slices of the patient outside the isocenter of the MRI system. The associated excitation frequencies $f_A^+$ and $f_A^-$ may here each be greater than or less than $f_O^*$ and/or $f_O$.

Then in a method step S7, if required or, for instance, depending on the application, the power of the RF excitation pulse actually generated by the RF power amplifier for exciting the specified slice can be adapted to the shifted excitation frequency. In particular here, the power for the RF excitation pulse can be increased, because, by virtue of the excitation frequency $f_A^+$ or $f_A^-$ now needed according to the set polarity being closer to the specified center frequency $f_O$, the RF power amplifier can supply or output more power, in accordance with the power curves 3, 4 shown schematically in FIG. 1.

Then the actual measurement, i.e. the excitation of the specified slice by the RF excitation pulse, is performed in a method step S8. A resultant echo or relaxation signal is detected and can ultimately be processed further into a cross-sectional image of the patient.

If it is ascertained in method step S5 that the currently set polarity of the slice-selection gradient already corresponds to the polarity associated with the smaller of the two determined differences, then the method described here can follow a second path 8 directly to the method step S8.

In a practical application, for instance in an actual examination of the patient, a multiplicity of single measurements are typically performed using a multiplicity of RF excitation pulses in order to image, for example, a multiplicity of different slices of the patient. For each of these single measurements, for each RF excitation pulse or, if required, for one group of RF excitation pulses at a time or a subsequence of the complete measurement, some or all of the method steps S3 to S8 can each be repeated or performed individually, which is indicated here as method step S9 in the form of a loop.

Thus in the method proposed here, a slice selection of an imaging by means of an MRI system is adapted automatically to given prevailing conditions, and this is done by selecting the excitation frequency $f_A^+$ and $f_A^-$ respectively of the associated slice-selection gradient automatically such that the excitation frequency advantageously lies within the possible frequency band, i.e. within the specified frequency range 5, of the RF power amplifier. Both the slice position of the slice to be excited, i.e. the slice to be measured, and the deviation of $f_O^*$ from $f_O$, can be taken into account in this process. Especially for relatively strong gradients or gradient fields and a relatively large deviation or distance of the required slice to be excited from the isocenter, the situation can otherwise arise in which, even should $f_O$ actually equal $f_O^*$, a currently required excitation frequency hits a limit of the specified frequency range 5 or even lies outside this frequency range.

Depending on whether $f_O^*$ is greater than or less than $f_O$, and depending on the position of the slice to be excited, the excitation frequency is selected so as to minimize an absolute difference between the selected excitation frequency and $f_O$. These absolute differences for the two possible excitation frequencies correspond here to the two possible polarities, i.e. to a positive or negative polarity of the slice-selection gradient. The configuration having the smaller absolute difference is then used. Firstly, this can ensure that the associated excitation frequency $f_A^+$ or $f_A^-$ that is then actually needed or used lies as centrally as possible in the available frequency band, thus as centrally as possible in the specified frequency range 5. The excitation can thereby be performed safely and reliably because it is ensured that the deviation or difference of $f_O^*$ from $f_O$ does not result in the required excitation frequency lying outside the specified frequency range 5.

Secondly, by virtue of the corresponding setting of the polarity of the slice-selection gradient, i.e. by virtue of the corresponding selection of the excitation frequency $f_A^+$ or $f_A^-$, the power of the RF power amplifier can be utilized optimally in a particularly advantageous manner. Hence either higher amplitudes can be achieved, because the closer the associated required excitation frequency $f_A^+$ or $f_A^-$ lies to $f_O$, the greater is the applied power, or it can be ensured that the RF power amplifier is used in a particularly protective manner, because less power needs to be obtained in, or from, the RF power amplifier for excitation frequencies lying closer to $f_O$ given the same pulse shape, i.e. given the same shape of the associated RF excitation pulse.

Thus the excitation frequency for exciting a currently specified slice or an associated slice-selection gradient can be set optimally here, wherein an actual position of a fundamental frequency of an associated scanner, i.e. of the MRI system or of its main magnet, corresponding to the actual frequency $f_O^*$, relative to the fundamental frequency intended theoretically or according to the specification, i.e. the specified center frequency $f_O$, can be taken into account, and hence the power that can be applied by the RF power amplifier can advantageously be utilized to the full or can be used with optimum efficiency. Advantages of this method are that deviations or shifts of $f_O^*$ from, i.e. with respect to, $f_O$ can be corrected especially in low-field systems, and the power of the RF power amplifier can be obtained advantageously in a manner optimized for the requirement.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for operating a magnetic resonance (MR) imaging apparatus in order to excite nuclear spins in a specified slice of an examination subject, said MR imaging apparatus comprising an MR data acquisition scanner that comprises a basic field magnet that produces a static basic magnetic field, and a radio-frequency (RF) power amplifier that emits RF pulses, said RF power amplifier being able to emit RF energy at a maximum power at a nominal center frequency $f_O$, wherein said nominal center frequency $f_O$ contributes to defining a strength of said static basic magnetic field, said method comprising:

providing a computer with an electronic representation of an MR data acquisition sequence for operating said MR data acquisition scanner in order to excite said nuclear spins in said specified slice of an examination subject in order to then acquire MR signals from the excited nuclear spins, said MR data acquisition sequence comprising at least one of said RF excitation pulses and at least one magnetic field gradient that is able to be switched between two opposite polarities in order to cause the magnetic field gradient to pass through the examination subject at least in a region of the examination subject in which said nuclear spins are to be excited;

in said computer, calculating respective excitation frequencies $f_A^+$ and $f_A^-$ individually for said two opposite polarities, which are respectively needed for said at least one RF excitation pulse to excite the nuclear spins in the specified slice when the slice-selection gradient is activated at each of said opposite polarities;

in said computer, calculating a first difference, between $f_A^+$ and $f_0$, and a second difference, between $f_A^-$ and $f_0$;

in said computer, identifying a smaller of said first and second differences, and setting the polarity of the slice-selection gradient to be activated during excitation of the nuclear spins in the specified slice as the polarity having the excitation frequency that produced the smaller of said first and second differences; and emitting electronic control signals from said computer to said MR data acquisition scanner in order to operate said MR data acquisition scanner according to said MR data acquisition sequence with the polarity of the slice-selection gradient that has been set according to the smaller of the first and second differences.

2. A method as claimed in claim 1 comprising, in said computer, determining a mathematically signed difference between said specified nominal center frequency $f_0$ and a frequency $f_0^*$ that contributes to defining a currently existing strength of said static basic magnetic field, before determining said excitation frequencies $f_A^+$ and $f_A^-$.

3. A method as claimed in claim 2 comprising determining the frequency $f_0^*$ in said computer from a calibration measurement executed with said MR data acquisition scanner, in which said computer operates said MR data acquisition scanner to acquire a spectrum without activating magnetic field gradients, and by identifying a position of a characteristic water peak in said spectrum.

4. A method as claimed in claim 2 comprising determining said first and second differences, and setting the polarity of said magnetic field gradient according to the smaller of said first and second differences, only when a magnitude of the difference between $f_0^*$ and $f_0$ exceeds a predetermined threshold value.

5. A method as claimed in claim 1 comprising operating said MR data acquisition scanner so as to produce said static basic magnetic field at a maximum strength of 1T.

6. A method as claimed in claim 1 wherein said MR data acquisition sequence comprises a plurality of RF excitation pulses, that define a repetition time between successive ones of said plurality of excitation pulses, and, in said computer, determining said first and second differences and setting the polarity of the slice-selection gradient dependent on the smaller of said first and second differences once per each repetition time.

7. A method as claimed in claim 1 comprising, in said computer, generating said control signals for said MR data acquisition sequence so as to also adjust an RF power output of said RF power amplifier for execution of said MR data acquisition sequence.

8. A magnetic resonance (MR) imaging apparatus comprising:

an MR data acquisition scanner comprising a basic field magnet that produces a static basic magnetic field, and a radio-frequency (RF) power amplifier that emits RF pulses, said RF power amplifier being able to emit RF energy at a maximum power at a nominal center frequency $f_0$, wherein said nominal center frequency $f_0$ contributes to defining a strength of said static basic magnetic field;

a computer provided with an electronic representation of an MR data acquisition sequence for operating said MR data acquisition scanner in order to excite nuclear spins in a specified slice of an examination subject in order to then acquire MR signals from the excited nuclear spins, said MR data acquisition sequence comprising at least one of said RF excitation pulses and at least one magnetic field gradient that is able to be switched between two opposite polarities in order to cause the magnetic field gradient to pass through the examination subject at least in a region of the examination subject in which said nuclear spins are to be excited;

said computer being configured to calculate respective excitation frequencies $f_A^+$ and $f_A^-$ individually for said two opposite polarities, which are respectively needed for said at least one RF excitation pulse to excite the nuclear spins in the specified slice when the slice-selection gradient is activated at each of said opposite polarities;

said computer being configured to calculate a first difference, between $f_A^+$ and $f_0$, and a second difference, between $f_A^-$ and $f_0$;

said computer being configured to identify a smaller of said first and second differences, and to set the polarity of the slice-selection gradient to be activated during excitation of the nuclear spins in the specified slice as the polarity having the excitation frequency that produced the smaller of said first and second differences; and said computer being configured to emit electronic control signals from said computer to said MR data acquisition scanner in order to operate said MR data acquisition scanner according to said MR data acquisition sequence with the polarity of the slice-selection gradient that has been set according to the smaller of the first and second differences.

9. A non-transitory, computer-readable data storage medium encoded with programming instructions, said storage medium being loaded into a computer of a magnetic resonance (MR) imaging apparatus, said MR imaging apparatus comprising an MR data acquisition scanner that comprises a basic field magnet that produces a static basic magnetic field, and a radio-frequency (RF) power amplifier that emits RF pulses, said RF power amplifier being able to emit RF energy at a maximum power at a nominal center frequency $f_0$, wherein said nominal center frequency $f_0$ contributes to defining a strength of said static basic magnetic field, said programming instructions causing said computer to:

receive an electronic representation of an MR data acquisition sequence for operating said MR data acquisition scanner in order to excite nuclear spins in a specified slice of an examination subject in order to then acquire MR signals from the excited nuclear spins, said MR data acquisition sequence comprising at least one of said RF excitation pulses and at least one magnetic field gradient that is able to be switched between two opposite polarities in order to cause the magnetic field gradient to pass through the examination subject at least in a region of the examination subject in which said nuclear spins are to be excited;

calculate respective excitation frequencies $f_A^+$ and f $f_A^-$ individually for said two opposite polarities, which are respectively needed for said at least one RF excitation pulse to excite the nuclear spins in the specified slice when the slice-selection gradient is activated at each of said opposite polarities;

calculate a first difference, between $f_A^+$ and $f_0$, and a second difference, between $f_A^-$ and $f_0$;

identify a smaller of said first and second differences, and set the polarity of the slice-selection gradient to be activated during excitation of the nuclear spins in the specified slice as the polarity having the excitation frequency that produced the smaller of said first and second differences; and emit electronic control signals from said computer to said MR data acquisition scanner in order to operate said MR data acquisition scanner according to said MR data acquisition sequence with the polarity of the slice-selection gradient that has been set according to the smaller of the first and second differences.

* * * * *